US009618849B2

(12) United States Patent
Muramatsu et al.

(10) Patent No.: US 9,618,849 B2
(45) Date of Patent: Apr. 11, 2017

(54) PATTERN FORMING METHOD, PATTERN FORMING APPARATUS, AND COMPUTER READABLE STORAGE MEDIUM

(71) Applicant: Tokyo Electron Limited, Tokyo (JP)

(72) Inventors: Makoto Muramatsu, Koshi (JP); Takahiro Kitano, Koshi (JP); Tadatoshi Tomita, Koshi (JP); Keiji Tanouchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 214 days.

(21) Appl. No.: 14/389,437

(22) PCT Filed: Mar. 28, 2013

(86) PCT No.: PCT/JP2013/059264
§ 371 (c)(1),
(2) Date: Sep. 30, 2014

(87) PCT Pub. No.: WO2013/150955
PCT Pub. Date: Oct. 10, 2013

(65) Prior Publication Data
US 2015/0062545 A1    Mar. 5, 2015

(30) Foreign Application Priority Data

Apr. 6, 2012   (JP) ................................ 2012-087106
Dec. 27, 2012  (JP) ................................ 2012-285132

(51) Int. Cl.
*G03B 27/32* (2006.01)
*G03B 27/54* (2006.01)
(Continued)

(52) U.S. Cl.
CPC ............ *G03F 7/40* (2013.01); *B81C 1/00031* (2013.01); *G03F 7/0002* (2013.01);
(Continued)

(58) Field of Classification Search
CPC ......... B81C 1/00031; B81C 2201/0149; G03F 7/0002; G03F 7/2002; G03F 7/40;
(Continued)

(56) References Cited

U.S. PATENT DOCUMENTS 6,507,031 B1 *   1/2003   Jinbo ................ H01L 21/02046
                                                            134/1
2006/0033893 A1 * 2/2006  Nakano ............... G03F 7/70933
                                                            355/30
(Continued)

FOREIGN PATENT DOCUMENTS

JP   2005-29779 A    2/2005
JP   2007-125699 A   5/2007
(Continued)

OTHER PUBLICATIONS

K.W. Guarini et al., "Optimization of Diblock Copolymer Thin Film Self Assembly", Advanced Materials, 2002, 14, No. 18, Sep. 16, pp. 1290-1294.
(Continued)

*Primary Examiner* — Colin Kreutzer
(74) *Attorney, Agent, or Firm* — Posz Law Group, PLC

(57) ABSTRACT

The present invention is a pattern forming method of forming a pattern on a substrate using a block copolymer, the pattern forming method including the steps of: forming a film of a block copolymer containing at least two kinds of polymers on the substrate; heating the film of the block copolymer; irradiating the heated film of the block copolymer with ultraviolet light in an atmosphere of an inert gas; and supplying an organic solvent to the film of the block copolymer irradiated with the ultraviolet light.

11 Claims, 10 Drawing Sheets

(51) Int. Cl.
  *G03F 7/40* (2006.01)
  *H01L 21/027* (2006.01)
  *H01L 21/033* (2006.01)
  *H01L 21/311* (2006.01)
  *H01L 21/67* (2006.01)
  *B81C 1/00* (2006.01)
  *G03F 7/20* (2006.01)
  *G03F 7/00* (2006.01)

(52) U.S. Cl.
  CPC ............ *G03F 7/2002* (2013.01); *G03F 7/405* (2013.01); *H01L 21/0271* (2013.01); *H01L 21/0337* (2013.01); *H01L 21/31133* (2013.01); *H01L 21/6715* (2013.01); *H01L 21/67109* (2013.01); *H01L 21/67178* (2013.01); *B81C 2201/0149* (2013.01); *H01L 21/67115* (2013.01)

(58) Field of Classification Search
  CPC . G03F 7/405; H01L 21/0271; H01L 21/0337; H01L 21/31133; H01L 21/67109; H01L 21/6715; H01L 21/67115; H01L 21/67178
  USPC ........................................ 355/27, 30, 67, 77
  See application file for complete search history.

(56) References Cited

U.S. PATENT DOCUMENTS

| 2006/0210929 | A1* | 9/2006 | Yamada | G03F 7/0382 |
| | | | | 430/311 |
| 2012/0244474 | A1* | 9/2012 | Asakawa | B81C 1/00031 |
| | | | | 430/296 |
| 2013/0313223 | A1* | 11/2013 | Fujikawa | B81C 1/00031 |
| | | | | 216/13 |

FOREIGN PATENT DOCUMENTS

| JP | 2007-324393 A | 12/2007 | |
| JP | 2012-033534 A | 2/2012 | |
| JP | 2012-166302 A | 9/2012 | |
| WO | 2011/039847 A1 | 4/2011 | |
| WO | 2012/111694 A1 | 8/2012 | |
| WO | WO 2012111694 A1 * | 8/2012 | ......... B81C 1/00031 |

OTHER PUBLICATIONS

International Search Report of the International Searching Authority mailed Jul. 2, 2013 for the corresponding international application No. PCT/JP2013/059264 (with English translation).

* cited by examiner (a)

(b)

(c)

(d)

PATTERN FORMING METHOD, PATTERN FORMING APPARATUS, AND COMPUTER READABLE STORAGE MEDIUM

TECHNICAL FIELD

The present invention relates to a directed self-assembly (DSA) lithography technique, and relates to a pattern forming method, a pattern forming apparatus, and a computer-readable storage medium storing a computer program causing the pattern forming apparatus to perform the pattern forming method, each utilizing the technique.

This application is based upon and claims the benefit of priority of the prior Japanese Patent Application No. 2012-87106, filed in Japan on Apr. 6, 2012, and the prior Japanese Patent Application No. 2012-285132, filed in Japan Dec. 27, 2012, the entire contents of which are incorporated herein by reference.

BACKGROUND ART

In recent years, the practical use of the directed self-assembly lithography technique utilizing a property that a block copolymer is self-assembled is discussed (for example, Patent Documents 1 and 2 and Non-Patent Document 1). In the directed self-assembly lithography technique, first, for example, a solution of a block copolymer containing an A polymer chain and a B polymer chain is applied to a substrate. Then, when the substrate is heated, the A polymer chain and the B polymer chain mutually randomly solid-dissolve undergo phase separation to form A polymer regions and B polymer regions which are regularly arrayed. Then, patterning the block copolymer is performed by removing either the A polymer regions or the B polymer regions, thereby forming a mask having a predetermined pattern.

PRIOR ART DOCUMENT

Patent Document

[Patent Document 1] Japanese Patent Application Laid-open No. 2005-29779
[Patent Document 2] Japanese Patent Application Laid-open No. 2007-125699
[Non-Patent Document 1] K. W. Guarini, et al., "Optimization of Diblock Copolymer Thin Film Self Assembly", Advanced Materials, 2002, 14, No. 18, September 16, pp. 1290-1294. (p. 1290, ll.31-51)

DISCLOSURE OF THE INVENTION

Problems to be Solved by the Invention

As the block copolymer, for example, a block copolymer (poly(styrene-block-methyl methacrylate): PS-b-PMMA) containing polystyrene (PS) as the A polymer chain and poly(methyl methacrylate) (PMMA) as the B polymer chain is known (Patent Document 1 and the like). When PS-b-PMMA is applied onto a wafer and the wafer is heated as described above, phase-separated PS regions and PMMA regions are regularly arrayed. Here, for example, at the time when the PMMA regions are removed to from a pattern, it is preferable to use an organic solvent to which the solubility of the PMMA regions is high and the solubility of the PS regions is low, namely, which has a high ratio (solubility ratio) of the solubility of the PMMA regions to the solubility of the PA regions. This is because if the solubility ratio is low, the PS regions in the pattern formed with the organic solvent become thin so that when a base layer is etched using the pattern as an etching mask, the mask may disappear.

However, since PS and PMMA are also organic matters, there is no organic solvent having a high solubility ratio in fact.

Hence, a method of irradiating the block copolymer applied on the substrate with an energy ray such as an electron ray, a γ-ray, or an X-ray, and rinsing away the irradiated block copolymer with an aqueous solvent or an organic solvent is discussed, for example, in Patent Document 1. When the phase separated PS-b-PMMA is irradiated with the energy ray, the main chain of PMMA is cut and PMMA becomes easy to dissolve in the organic solvent, so that the solubility ratio can be also increased. However, it cannot be said that an enough solubility ratio can be realized whereas it is desirable to increase as much as possible the solubility ratio between the A polymer regions and the B polymer regions.

In consideration of the above circumstances, the present invention provides a pattern forming apparatus, a pattern forming method, and a computer-readable storage medium storing a computer program causing the pattern forming apparatus to perform the pattern forming method, each capable of improving the solubility ratio between an A polymer and a B polymer in a block copolymer with respect to an organic solvent.

Means for Solving the Problems

According to a first aspect of the present invention, there is provided a pattern forming method including the steps of: forming a film of a block copolymer containing at least two kinds of polymers on a substrate; heating the film of the block copolymer; irradiating the heated film of the block copolymer with ultraviolet light in an atmosphere of an inert gas; and supplying an organic solvent to the film of the block copolymer irradiated with the ultraviolet light.

According to a second aspect of the present invention, there is provided a pattern forming apparatus including: a film forming unit that supplies a coating solution containing a block copolymer to a substrate to form a film of the block copolymer on the substrate; a heating unit that heats the substrate on which the film of the block copolymer has been formed by the film forming unit; an ultraviolet light irradiation unit that comprises therein an inert gas supply unit that supplies an inert gas, and irradiates the heated film of the block copolymer with ultraviolet light in an atmosphere of the inert gas; and a solution treatment unit that supplies an organic solvent to the film of the block copolymer irradiated with the ultraviolet light.

The present invention according to still another aspect is a computer-readable storage medium storing a computer program causing the pattern forming apparatus to perform the above-described pattern forming method.

Effect of the Invention

According to the present invention, it is possible to further improve the solubility ratio between an A polymer region and a B polymer region in a block copolymer with respect to an organic solvent, than in the prior art.

BEST MODE FOR CARRYING OUT THE INVENTION

Figure 1:
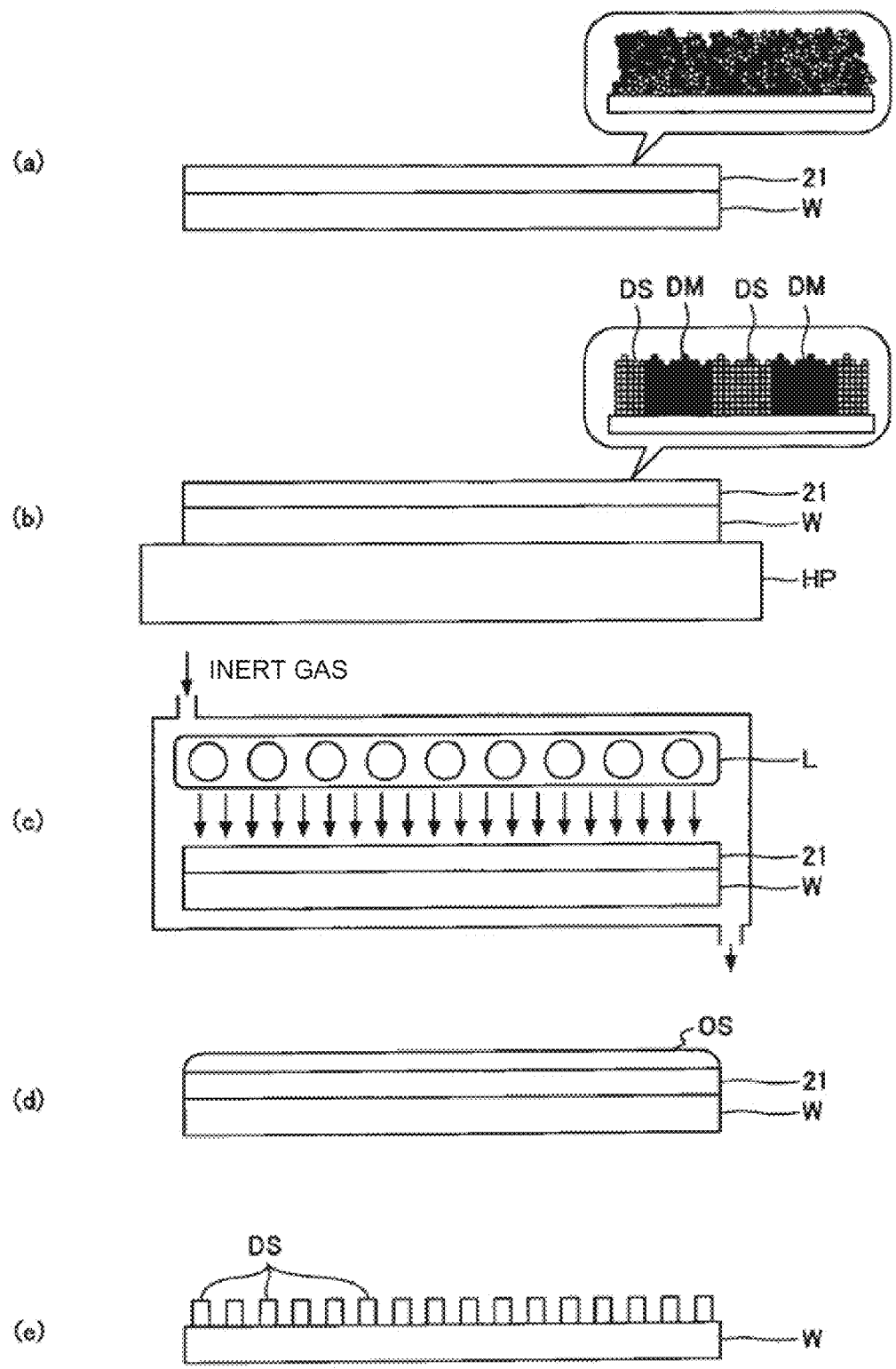
FIG. 1 A view for explaining a pattern forming method according to a first embodiment of the present invention.

Hereinafter, not-limiting illustrative embodiments of the present invention will be described referring to the accompanying drawings. The same or corresponding reference numerals are given to the same or corresponding components or members in the accompanying drawings to omit repeated description.

First Embodiment

Referring to FIG. 1, a pattern forming method according to a first embodiment of the present invention will be described. A solution (also referred to as a coating solution) made by dissolving polystyrene (PS)-poly(methyl methacrylate) (PMMA) block copolymer (hereinafter, PS-b-PMMA) in an organic solvent is prepared first. The organic solvent is not particularly limited as long as it is highly compatible with PS and PMMA constituting PS-b-PMMA, and may be, for example, toluene, propylene glycol monomethyl ether acetate (PGMEA).

Next, when the coating solution is applied onto a semiconductor wafer (hereinafter, simply, a wafer) W as a substrate, for example, by the spin coating method, a film 21 of PS-b-PMMA is formed as illustrated in FIG. 1(a). As schematically illustrated in an inserted drawing in FIG. 1(a), a PS polymer and a PMMA polymer randomly mix together in the film 21.

Then, when the wafer W on which the film 21 of PS-b-PMMA has been formed is heated, for example, by a hot plate HP to a predetermined temperature, phase separation occurs in PS-b-PMMA as illustrated in FIG. 1(b). By the phase separation, PS regions DS and PMMA regions DM are alternately arrayed as illustrated in an inserted drawing in FIG. 1(b). Here, a width of the PS region DS is determined to be an integral multiple of the molecular length of PS and a width of the PMMA region DM is determined to be an integral multiple of the molecular length of PMMA, so that the PS region DS and the PMMA region DM are repeatedly arrayed at a predetermined pitch (the width of the PS region DS+the width of the PMMA region DM) in the film 21 of PS-b-PMMA. Further, since the width of the PS region DS is determined by the polymerization number of the PS molecule and the width of the PMMA region DM is determined by the polymerization number of the PMMA molecule, a desired pattern can be determined by adjusting the polymerization number. Note that it is preferable to form a guider pattern on the surface of the wafer W in order to array the PS regions DS and the PMMA regions DM of PS-b-PMMA in a predetermined pattern.

After finish of the heating, the film 21 of PS-b-PMMA on the wafer W is irradiated with ultraviolet light, for example, by a light source L in an atmosphere of a rare gas such as argon (Ar) or helium (He) or an inert gas such as a nitrogen gas as schematically illustrated in FIG. 1(c). The ultraviolet light is not particularly limited as long as it has a wavelength component belonging to an ultraviolet light region, but is preferably has a wavelength component of, for example, 200 nm or less. Further, the ultraviolet light further preferably contains a wavelength component of 185 nm or less that can be absorbed by PMMA. In the case of using the ultraviolet light having a wavelength component with a wavelength of 200 or less, an Xe excimer lamp emitting ultraviolet light with a wavelength of 172 nm can be preferably used as the light source L.

It is considered that when the film 21 of PS-b-PMMA is irradiated with the ultraviolet light, PS becomes difficult to dissolve in the organic solvent because crosslinking reaction occurs in PS, whereas PMMA becomes easy to dissolve in the organic solvent because the main chain is cut in PMMA. Note that in the case of using the ultraviolet light with a wavelength of 172 nm, its irradiation intensity (dose amount) is preferably about 180 mJ or less. Irradiation of the film 21 of PS-b-PMMA with the ultraviolet light with a wavelength of 172 nm at a dose amount of greater than 180 mJ makes the organic solvent easy to permeate the PS regions DS when the organic solvent is supplied to the film 21 of PS-b-PMMA afterwards, with the result that the PS regions DS swell and the PMMA regions DM become difficult to remove. Further, in the case where the dose amount of the ultraviolet light is greater than 180 mJ, the PMMA regions DM may change in quality and solidify and thus may become difficult to dissolve in the organic solvent.

Note that an oxygen concentration in the atmosphere around the wafer W is decreased due to the inert gas and, concretely, an oxygen concentration in the inert gas atmosphere of 400 ppm or less is sufficient as will be described later.

Next, as illustrated in FIG. 1(d), an organic solvent OS is supplied to the film 21 of PS-b-PMMA. Due to the organic solvent OS, the PMMA regions DM in the film 21 dissolve and the PS regions DS remain on the surface of the wafer W. Here, as the organic solvent OS, for example, isopropyl alcohol (IPA) can be preferably used.

When the surface of the wafer W is dried after a lapse of a predetermined time, a pattern composed of the PS regions DS is obtained on the surface of the wafer W as illustrated in FIG. 1(e).

Next, an example that the pattern forming method according to an embodiment of the present invention is applied to the case of forming a hole (corresponding to a contact hole or a via hole) in the substrate (for example, a silicon wafer) will be described referring to FIG. 2. In the following description, irradiation of the film of PS-b-PMMA with the ultraviolet light is called exposure, and dissolving the PMMA regions with the organic solvent is called development in some cases. Note that FIG. 2(A) to FIG. 2(D) are top views and FIG. 2(a) to FIG. 2(d) are cross-sectional views taken along lines I-I corresponding to FIG. 2(A) to FIG. 2(D).

Figure 2:
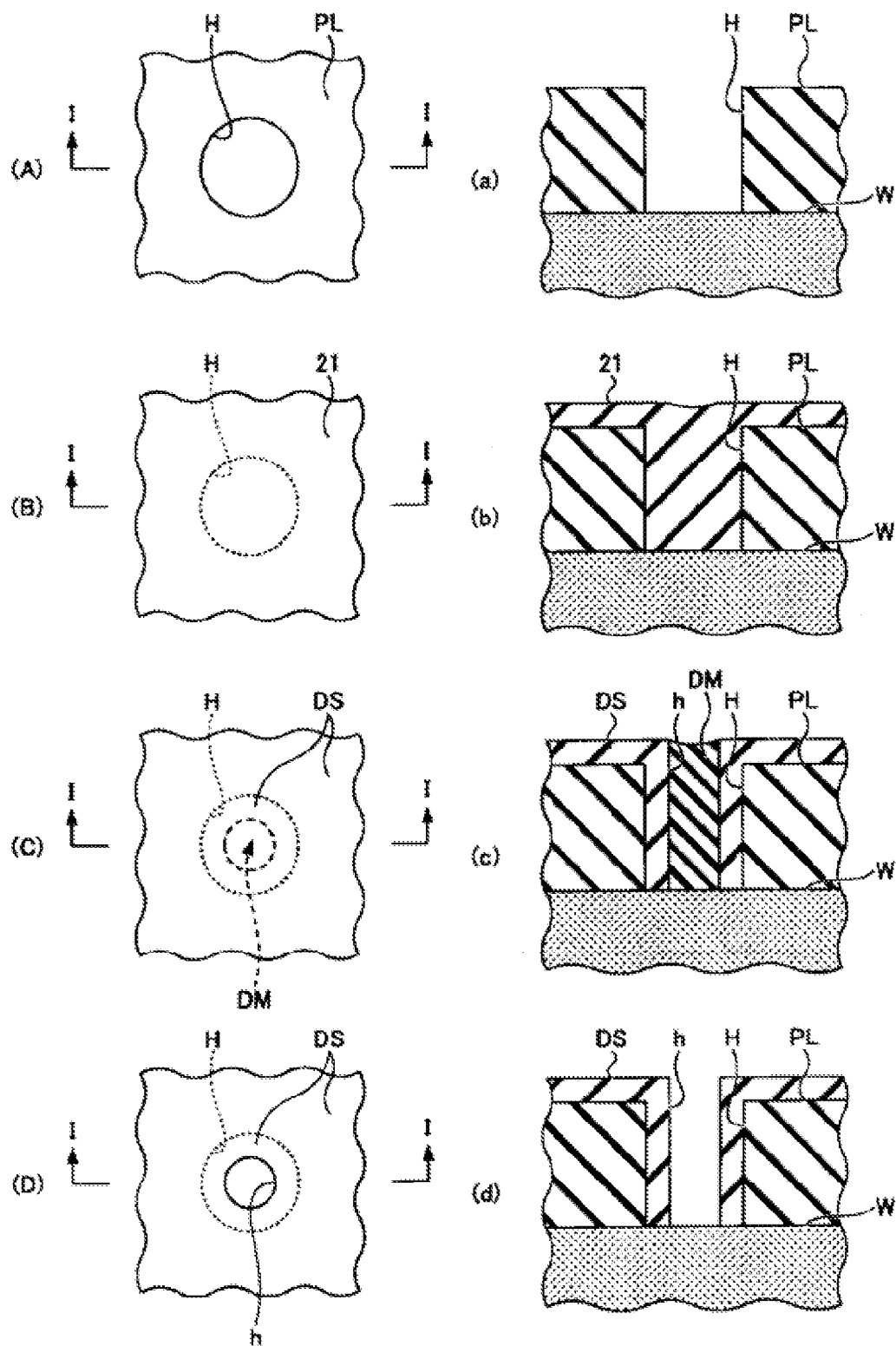
FIG. 2 A view for explaining an example of applying the pattern forming method according to the first embodiment of the present invention to a case of forming holes in a substrate.

First, a photoresist layer PL is formed on the surface of the wafer W, and a plurality of holes H are formed in the photoresist layer PL as illustrated in FIG. 2(A) and (a) (one hole H is illustrated for convenience in FIG. 2). The holes H can be formed by the conventional photolithography technique. The inside diameter of the hole H may be, for example, about 90 nm.

Next, for example, toluene is used as a solvent, and PS-b-PMMA is dissolved into the solvent to prepare a coating solution. The concentration of solid components of PS-b-PMMA in the coating solution may be, for example, about 2 vol %. The coating solution is applied onto the above-described photoresist layer PL and the wafer W, for example, by a spin coater to form a film 21 of PS-b-PMMA. Here, as illustrated in FIGS. 2(B) and (b), the hole H is filled with the film 21 of PS-b-PMMA. Further, PS and PMMA have randomly mixed together at this time.

When the wafer W on which the film 21 of PS-b-PMMA has been formed is heated, for example, on the hot plate at a temperature of about 150° C. to about 250° C. for about 30 seconds to about 10 minutes, PS and PMMA undergo phase separation. As a result, as illustrated in FIGS. 2(C) and (c), the PS region DS having a cylindrical shape is arranged along the internal wall of the hole H, and the PMMA region DM having a columnar shape is arranged at the center of the PS region DS.

After cooling the wafer W down to approximately room temperature, the Xe excimer lamp is used to irradiate (expose) the film 21 of PS-b-PMMA with (to) the ultraviolet light (wavelength of 172 nm) in the inert gas atmosphere, for example, for 10 seconds to about 60 seconds.

After the exposure, for example, in a later-described solution treatment unit, the organic solvent (for example, IPA) is dripped to the wafer W on which the film 21 of PS-b-PMMA has been formed, and IPA is accumulated on the film 21. After a lapse of, for example, about 30 seconds to about 3 minutes, the wafer W is rotated to dry IPA. This forms a hole h demarcated by the PS region DS as illustrated in FIGS. 2(D) and (d). The hole h has an inside diameter smaller than the inside diameter (90 nm) of the hole H formed in the photoresist layer PL. The inside diameter of the hole h can be adjusted by a mixture ratio between PS and PMMA in PS-b-PMMA, and is about 30 nm in this example. When etching the wafer W being a base using the film 21 of PS-b-PMMA having the holes h, holes having an inside diameter almost equal to the inside diameter of the holes h are formed in the wafer W. By the pattern forming method according to this embodiment, it becomes possible to obtain the holes h having the inside diameter smaller than a limit dimension (for example, about 60 nm) that can be realized by the conventional photolithography technique.

Figure 3:
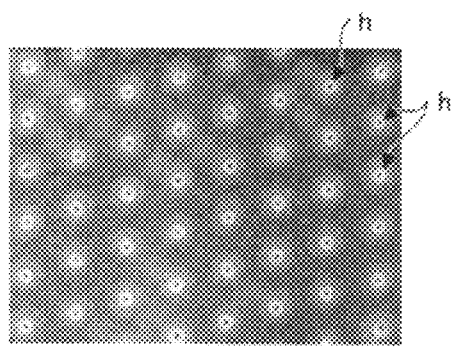
FIG. 3 Upper surface images by a scanning electron microscope (SEM) showing the holes formed according to the pattern forming method according to the first embodiment of the present invention.
Figure 3:
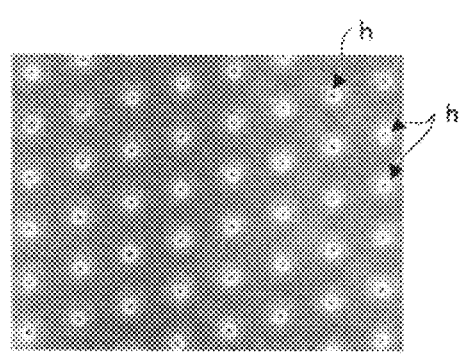
Figure 3:
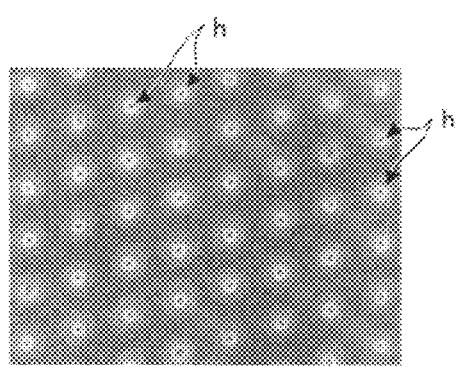
Figure 3:
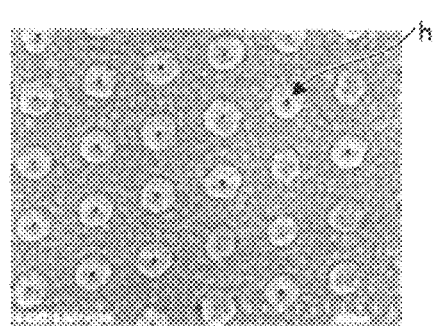

Next, the result of observation of the hole h (FIGS. 2(D) and (d)) formed according to the above-described method as Example 1, under a scanning electron microscope (SEM) will be described. In this example, the inert gas atmosphere when exposing the film of PS-b-PMMA on the wafer with the ultraviolet light (wavelength of 172 nm) was produced using a nitrogen gas. Further, the oxygen concentration in the nitrogen gas atmosphere was adjusted to 6 ppm, 150 ppm, and 400 ppm. As Comparative Example, an experiment was carried out also in the case where the film 21 of PS-b-PMMA was exposed to the ultraviolet light (wavelength of 172 nm) in the atmosphere of air. These results (SEM images) are shown in FIG. 3.

As shown in FIGS. 3(a) to (c), the holes h by the PS regions are opened in the case of exposing the film of PS-b-PMMA to the ultraviolet light in the inert gas atmosphere. On the other hand, as shown in FIG. 3(d), in the case of exposing the film of PS-b-PMMA to the ultraviolet light in the air atmosphere, the inside diameter of the holes is smaller than the holes shown in FIGS. 3(a) to (c) (it should be noted that the magnification of the SEM image in FIG. 3(d) is larger than the magnification of the SEM images in FIGS. 3(a) to (c)), and places where no holes are formed are found here and there. It is considered that in the atmosphere containing oxygen at a high concentration (the oxygen concentration in air is about 20%), the PMMA regions become difficult to dissolve into IPA because the film of PS-b-PMMA is excessively oxidized by the ultraviolet light and changes in quality. Further, from the fact that the surfaces (the surfaces of the PS regions) are rough when referring to FIG. 3(d), the PS regions are also considered to be excessively oxidized and change in quality.

It is considered that in the inert gas atmosphere, on the other hand, the change in quality of the film of PS-b-PMMA is prevented because the excessive oxidation of PMMA is suppressed. In particular, referring to FIGS. 3(a) to (c), it is presumed that when the oxygen concentration in the inert gas atmosphere is about 400 ppm or less, change in quality due to the ultraviolet light does not occur both in PS and PMMA. From the above result, the effect of exposing the film of PS-b-PMMA to the ultraviolet light in the inert gas atmosphere is understandable.

Figure 4:
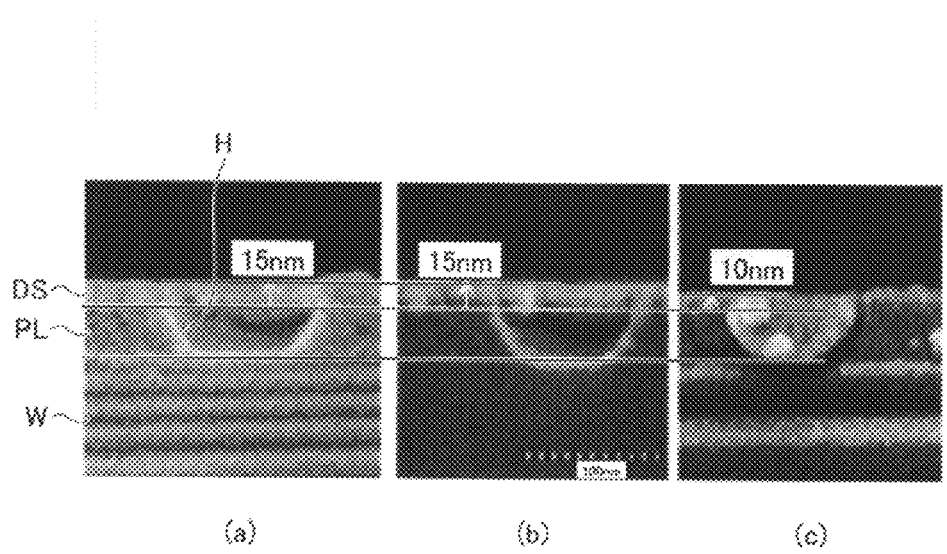
FIG. 4 Cross-sectional views by SEM showing the hole formed according to the pattern forming method according to the first embodiment of the present invention.

Next, the result of investigating the change in film thickness in the PMMA region before and after development will be explained. FIG. 4 is SEM images showing the cross section of the hole formed according to the above-described method. FIG. 4 is cross-sectional images of cut surfaces of the wafer W, the photoresist layer PL, and the PS region cut along a line I-I in FIG. 2(D) observed under the SEM from a direction vertical to the cut surfaces. However, the PS region in the hole H has been removed, and therefore not the hole h but the hole H is seen.

FIG. 4(a) shows a cross-sectional image before development by IPA, and the thickness of the PS region DS on the photoresist layer PL is about 15 nm. FIG. 4(b) shows a cross-sectional image after development. Also in FIG. 4(b), the thickness of the PS region DS on the photoresist layer PL is about 15 nm. Namely, the PS region DS rarely dissolves in IPA. In consideration of the fact that the PMMA region substantially dissolves by development, a solubility ratio (solubility of PMMA/solubility of PS) becomes almost infinite.

Further, FIG. 4(c) shows, for comparison, the result in the case of developing the film of PS-b-PMMA with oxygen plasma by a reactive ion etching (RIE) apparatus. As shown in FIG. 4(c), the thickness of the PS region DS remaining on the photoresist layer PL is about 10 nm. According to this result, an etching rate ratio (etching rate of PMMA/etching rate of PS) with the RIE oxygen plasma is about 7. From these results, the pattern forming method according to this embodiment can be said to have a significant effect to the development by RIE.

Second Embodiment

Figure 5:
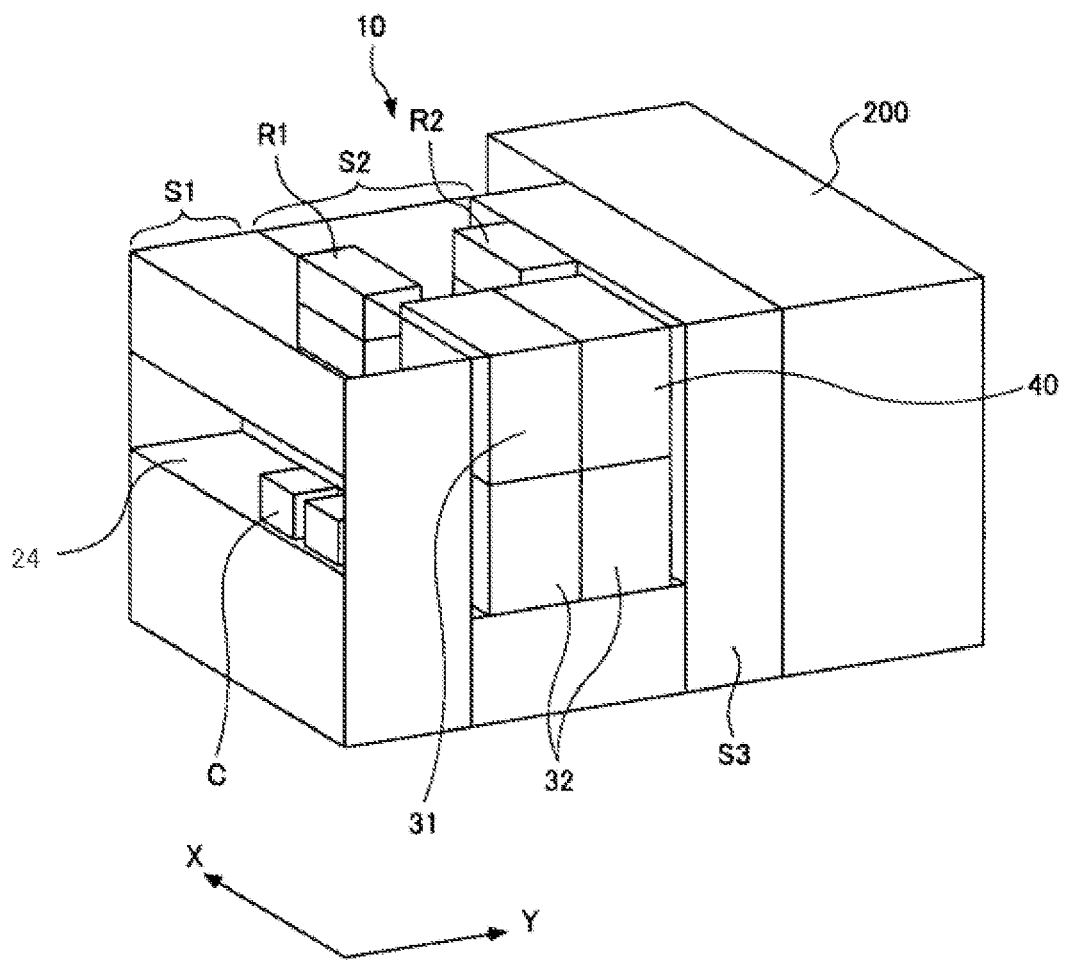
FIG. 5 A perspective view illustrating a pattern forming apparatus according to a second embodiment of the present invention.
Figure 6:
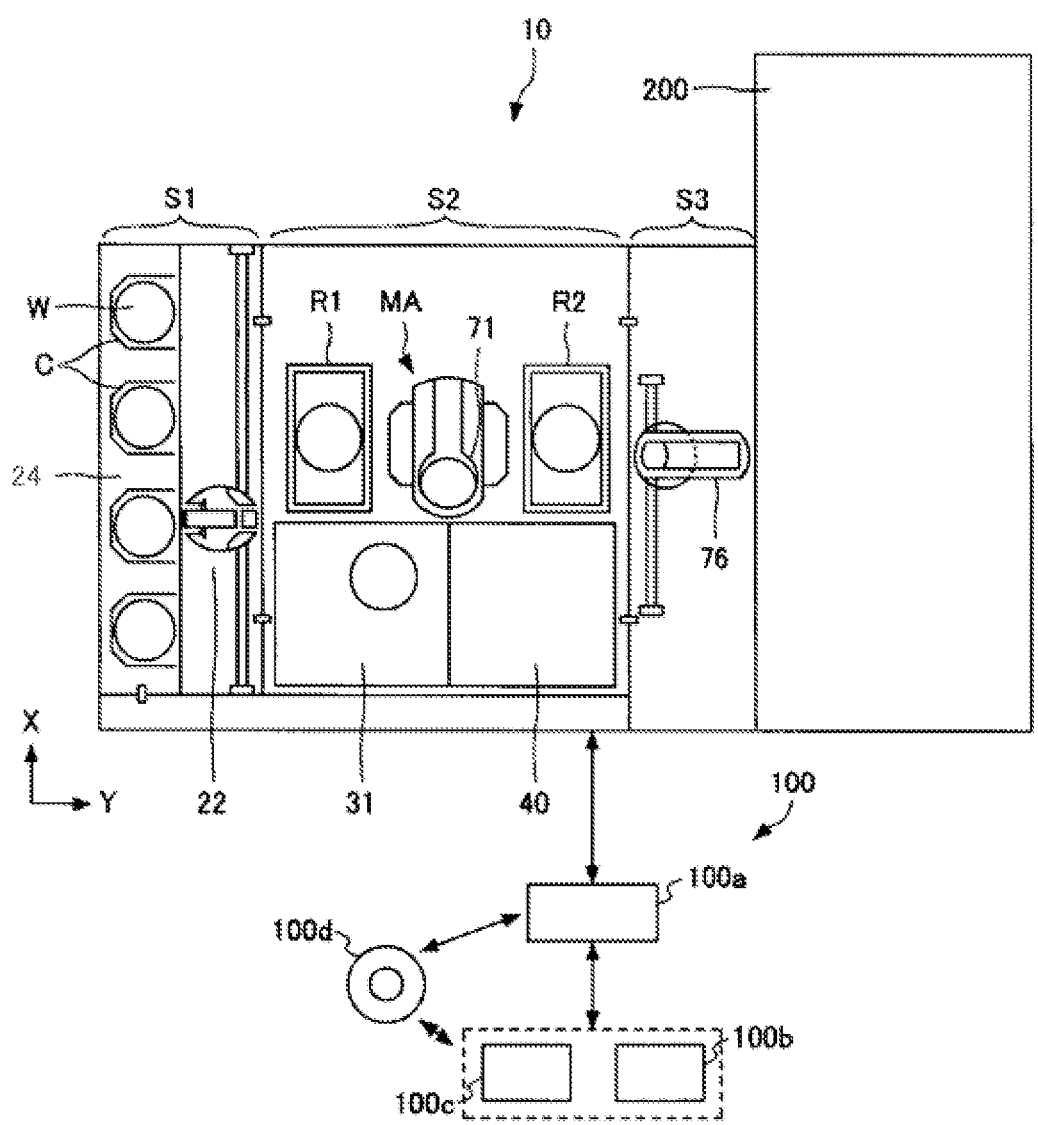
FIG. 6 A plan view illustrating the pattern forming apparatus in FIG. 5.

Next, a pattern forming apparatus according to a second embodiment of the present invention referable for implementing the pattern forming method (including a hole forming method) according to the first embodiment will be described referring to FIG. 5 to FIG. 9. FIG. 5 is a schematic perspective view illustrating a pattern forming apparatus 10 according to this embodiment. FIG. 6 is a schematic top view illustrating the pattern forming apparatus 10. Referring to FIG. 5 and FIG. 6, the pattern forming apparatus 10 has a cassette station S1, a treatment station S2, and an interface station S3.

In the cassette station S1, a cassette stage 24 and a transfer arm 22 (FIG. 6) are provided. On the cassette stage 24, a plurality of (for example, four) cassettes C each capable of housing a plurality of (for example, 25) wafers W are placed. In the following description, a direction in which the cassettes C are arranged side by side is an X-direction and a direction perpendicular thereto is a Y-direction for convenience.

The transfer arm 22 is configured to be able to rise and lower, move in the X-direction, expand and contract in the Y-direction, and rotate around a vertical axis, so as to deliver the wafer W between the cassette C on the cassette stage 24 and the treatment station S2.

The treatment station S2 is coupled on a +Y-direction side to the cassette station S1. In the treatment station S2, two coating units 32 are arranged along the Y-direction, and a solution treatment unit 31 and an ultraviolet light irradiation unit 40 are arranged in this order in the Y-direction on the two coating units 32 (FIG. 5). Further, referring to FIG. 6, a shelf unit R1 is arranged on a +X-direction side with respect to the coating unit 32 and the solution treatment unit 31, and a shelf unit R2 is arranged on the +X-direction side with respect to the coating unit 32 and the ultraviolet light irradiation unit 40. In the shelf units R1 and R2, treatment units corresponding to the treatments performed on the wafer are stacked as will be described later.

At almost the center of the treatment station S2, a main transfer mechanism MA (FIG. 6) is provided, and the main transfer mechanism MA has an arm 71. The arm 71 is configured to be able to rise and lower, move in the X-direction and the Y-direction, and rotate around the vertical axis so as to transfer in/out the wafer W from/to the coating units 32, the solution treatment unit 31, the ultraviolet light irradiation unit 40, and the treatment units in the shelf units R1 and R2.

Figure 7:
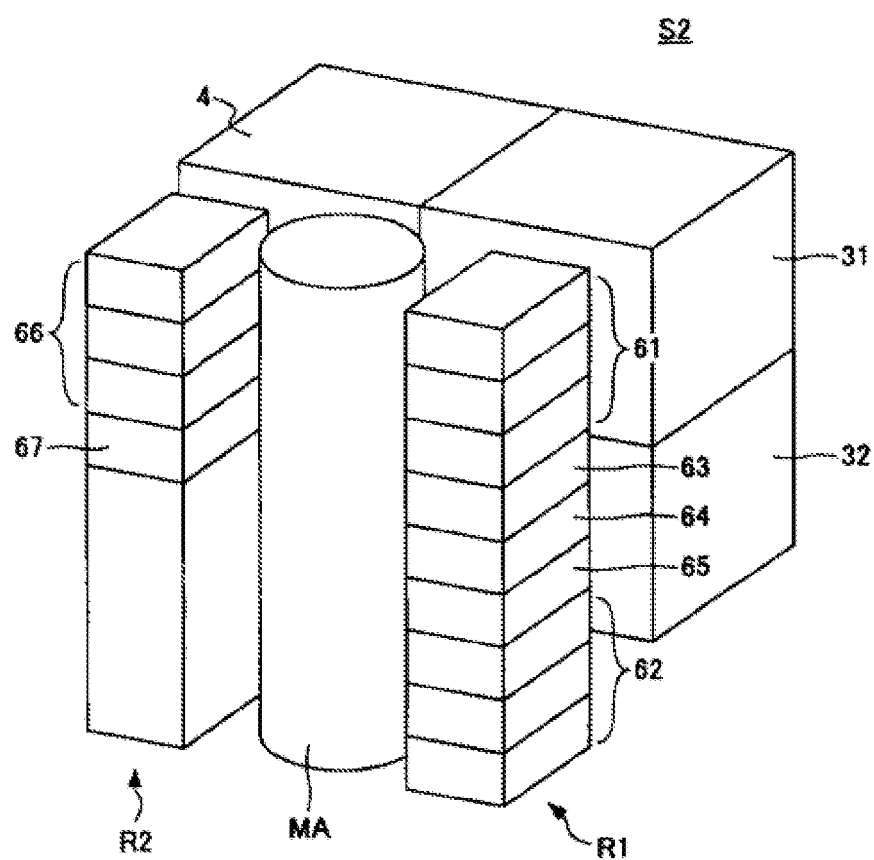
FIG. 7 Another perspective view illustrating the pattern forming apparatus in FIG. 5.

As illustrated in FIG. 7, in the shelf unit R1, heating units 61 each of which heats the wafer W, cooling units 62 each of which cools the wafer W, a hydrophobic unit 63 which makes the wafer surface hydrophobic, a pass unit 64 having a stage on which the wafer W is temporarily placed, an alignment unit 65 which aligns the wafer W and so on are arrayed in the vertical direction. Further, in the shelf unit R2, a plurality of CHP units 66 each of which heats and then cools the wafer W, a pass unit 67 having a stage on which the wafer W is temporarily placed and so on are arrayed in the vertical direction. Note that the kinds and arrays of the units in the shelf units R1 and R2 are not limited to those illustrated in FIG. 7 but may be variously changed.

Next, the solution treatment unit 31 will be described referring to FIG. 8. The solution treatment unit 31 has a housing 31C and has, in the housing 31C, a spin chuck 2 that rotatably holds the wafer W, a chemical supply nozzle 5 that is movable along the surface of the wafer W held on the spin chuck 2 and supplies (discharges) an organic solvent to the wafer W, and a cup 6 that surrounds the outer periphery of the wafer W held on the spin chuck 2 and receives the organic solvent that is supplied from the chemical supply nozzle 5 to the surface of the wafer W and scatters due to the rotation of the wafer W. Note that one side wall of the housing 31 C is formed with a transfer-in and transfer-out port (not illustrated), and the transfer-in and transfer-out port can be opened and closed by a shutter (not illustrated).

The cup 6 is formed in a cylindrical shape, for example, with the lower surface closed and the upper surface opened. At a bottom portion of the cup 6, an exhaust port 6*a* and a drain port 6*b* are provided. To the exhaust port 6*a*, an exhaust pipe 16 is connected which is connected to an exhaust apparatus (not illustrated) such as an exhaust pump or the like. Further, to the drain port 6*b*, a drain pipe 17 is connected which is connected to, for example, a drain section (not illustrated) of a factory so that the organic solvent recovered by the cup 6 is drained to the outside of the solution treatment unit 31.

To the spin chuck 2, for example, a servo motor 12 is coupled, and the spin chuck 2 and the wafer W held on the spin chuck 2 are rotated at a predetermined rotation speed by the servo motor 12.

Figure 8:
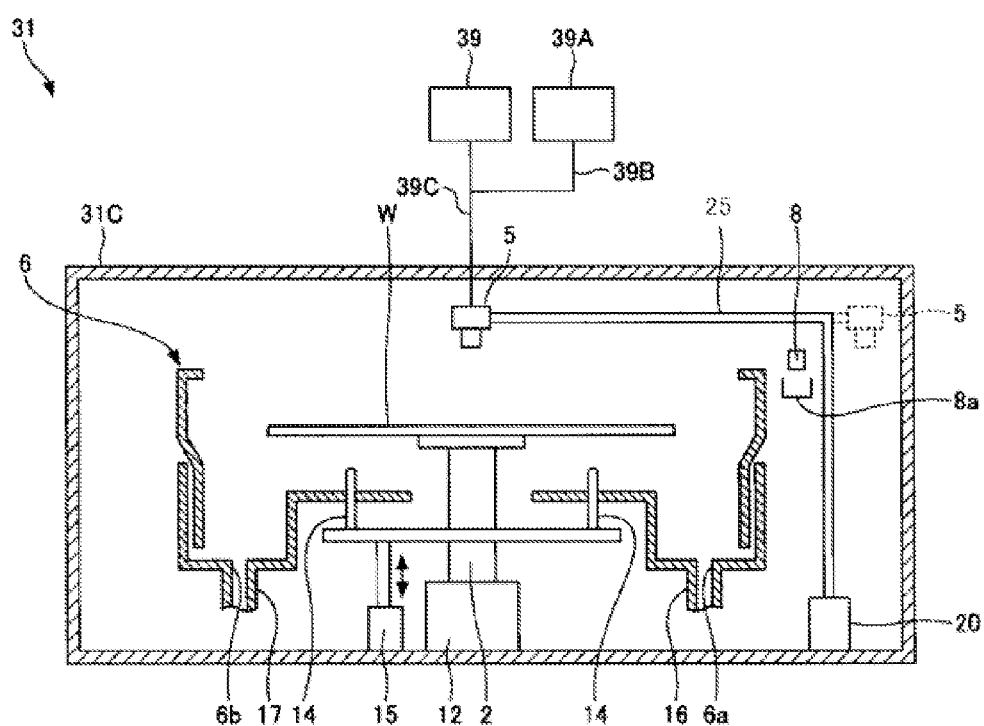
FIG. 8 A schematic view illustrating a solution treatment unit of the pattern forming apparatus in FIG. 5.

Further, in a manner to surround the spin chuck 2, for example, three support pins 14 are provided which support and raise and lower the wafer W (two support pins 14 are illustrated in FIG. 8). The support pins 14 can pass through through holes (not illustrated) formed in the bottom portion of the cup 6 and rise and lower by means of a raising and lowering drive mechanism 15 such as a cylinder. The support pins 14 can project to a position higher than the upper surface of the spin chuck 2 and deliver the wafer W to/from the spin chuck 2.

The chemical supply nozzle 5 is supported by a pivoting and raising and lowering arm 25 coupled to a moving mechanism 20 that is arranged outside the cup 6 and has a horizontally pivoting and raising and lowering function as illustrated in FIG. 8. By means of the moving mechanism 20, the chemical supply nozzle 5 is movable between a position outside the cup 6 (position indicated with a dotted line) and a position above the center of the wafer W (position indicated with a solid line). Further, the chemical supply nozzle 5 is connected to a chemical supply source 39 that stores the organic solvent via a chemical supply pipe 39C, and can supply the organic solvent supplied from the chemical supply source 39 to the wafer W. Further, in this embodiment, a branch pipe 39B is connected to the chemical supply pipe 39C, and the branch pipe 39B is connected to an additive supply source 39A. The additive supply source 39A stores a hydrophobic agent (later described) such as a sililation agent and can add the hydrophobic agent to the organic solvent supplied from the chemical supply source 39 by switching of a not-illustrated valve.

Note that as a matter of course, flow rate regulators that regulate the flow rates of the organic solvent and the hydrophobic agent may be provided at the chemical supply pipe 39C and the branch pipe 39B.

Outside the cup 6, a rinse solution discharge nozzle 8 is provided which supplies a rinse solution toward the wafer W held on the spin chuck 2. Further, for the rinse solution discharge nozzle 8, a waiting section 8*a* is provided. Further, the rinse solution discharge nozzle 8 can move between a position above the center of the wafer W and the waiting section 8*a* by means of a moving mechanism and a pivoting and raising and lowering arm (not illustrated) similarly to the chemical supply nozzle 5. Further, the rinse solution discharge nozzle 8 is connected to a rinse solution supply source (not illustrated) placed outside the solution treatment unit 31 via a rinse solution supply pipe (not illustrated) and thereby can supply the rinse solution supplied from the rinse solution supply source to the wafer W.

The coating unit 32 (FIG. 5) has the same configuration as that of the solution treatment unit 31. However, the chemical supply source 39 stores the solution (coating solution) made by dissolving, for example, PS-b-PMMA in an organic solvent, and PS-b-PMMA is supplied from the chemical supply nozzle 5. Repeated description of the coating unit 32 is omitted.

Referring again to FIG. 5 and FIG. 6, the interface station S3 is coupled to the +Y-direction side of the treatment station S2, and an exposure apparatus 200 is coupled to the +Y-direction side of the interface station S3. The exposure apparatus 200 can be used for forming the holes H in the photoresist layer PL in the formation of the holes h described referring to FIG. 2.

Further, in the interface station S3, a transfer mechanism 76 (FIG. 6) is arranged. The transfer mechanism 76 is configured to be able to rise and lower, move in the X-direction, expand and contract in the Y-direction, and rotate around a vertical axis, so as to transfer in/out the wafer W between the pass unit 67 (FIG. 7) in the shelf unit R2 in the treatment station S2 and the exposure apparatus 200.

Further, in the pattern forming apparatus 10, a control unit 100 for controlling the operation of the whole apparatus is provided as illustrated in FIG. 6. In the control unit 100, a process controller 100a including a processor composed of a CPU (Central Processing Unit), an MPU (Micro Processing Unit) or the like to control components or members of the pattern forming apparatus 10, a user interface part 100b, and a storage part 100c are provided.

The user interface part 100b is composed of a keyboard through which a process manager performs input operation of commands for managing the pattern forming apparatus 10, a display that displays the operation status of the pattern forming apparatus 10, and so on.

The storage part 100c stores a control program (software) for realizing various treatments performed in the pattern forming apparatus 10 through control by the process controller 100a, and recipes in which treatment condition data and so on are stored. Then, an arbitrary recipe is called from the storage part 100c when necessary by the instruction from the user interface part 100b or the like and executed by the processor controller 100a, whereby a desired function is executed by the pattern forming apparatus 10 under control of the process controller 100a to perform a desired treatment. Namely, the program controls the computer to cause the pattern forming apparatus 10 to function as a means for performing, for example, a later-described pattern forming method. Further, the program (and the recipe of treatment condition data and so on) has been stored in a computer-readable program storage medium 100d (for example, a hard disk, a compact disk, a magneto-optical disk, a memory card, a flexible disk or the like) and is installed into the storage part 100c through a predetermined input/output (I/O) apparatus (not illustrated). Alternatively, the program may be installed into the storage part 100c via, for example, a dedicated line from another apparatus such as a server apparatus.

Figure 9:
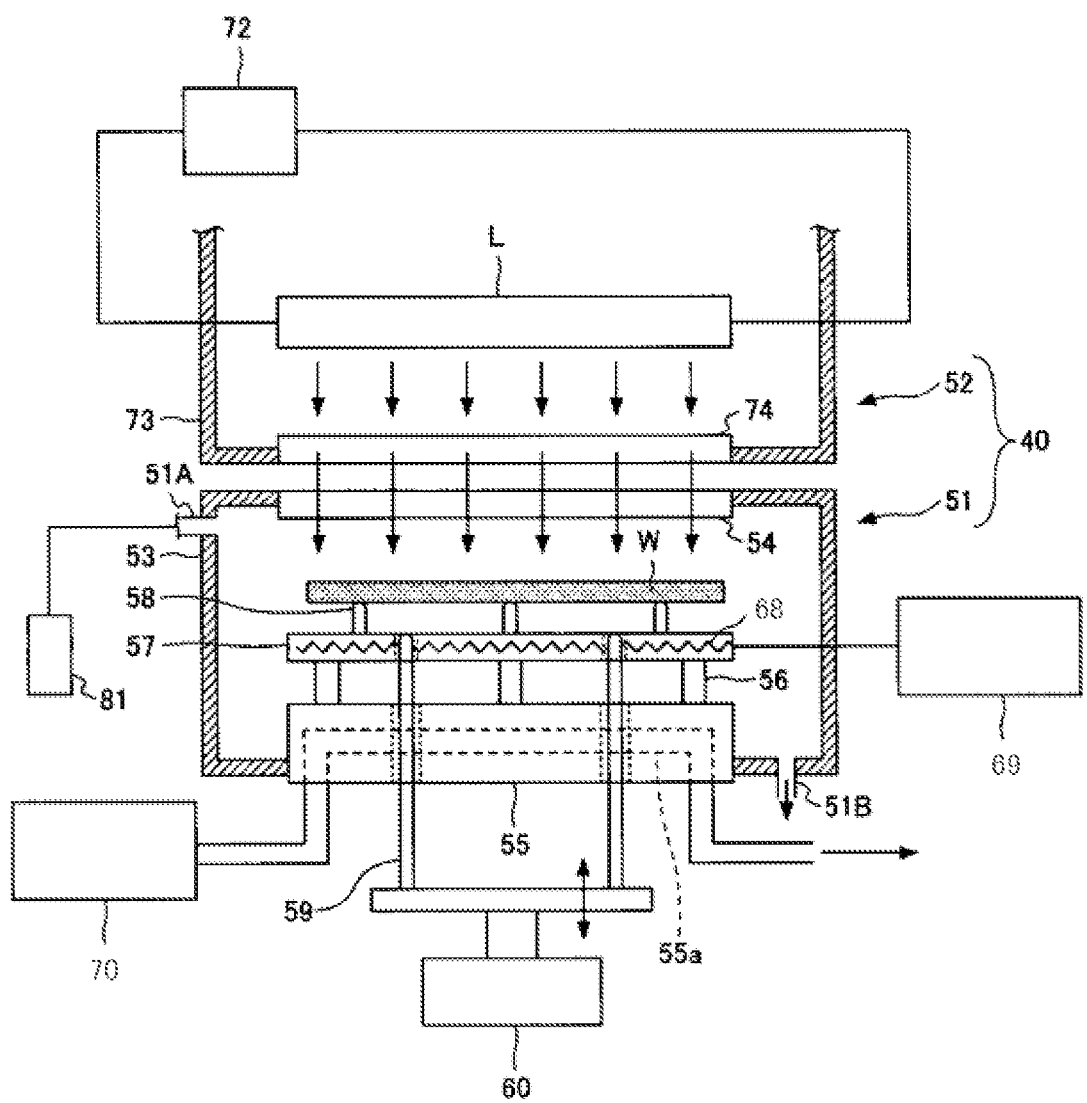
FIG. 9 A schematic view illustrating an ultraviolet light irradiation unit of the pattern forming apparatus in FIG. 5.

Next, the ultraviolet light irradiation unit 40 will be described referring to FIG. 9. As illustrated in FIG. 9, the ultraviolet light irradiation unit 40 has a wafer chamber 51 that houses the wafer W, and a light source chamber 52 that irradiates the wafer W housed in the wafer chamber 51 with the ultraviolet light.

The wafer chamber 51 includes a housing 53, a transmission window 54 that is provided at a ceiling portion of the housing 53 and can transmit the ultraviolet light, and a susceptor 57 above which the wafer W is placed. The transmission window 54 is formed of, for example, quartz glass.

The susceptor 57 has a disk shape and has a heater 68 therein. The heater 68 is connected to a temperature regulator 69, whereby the temperature of the susceptor 57 is regulated to a predetermined temperature. Further, on an upper surface of the susceptor 57, a plurality of (for example, three) support pins 58 that support the wafer W are provided. The susceptor 57 has a diameter equal to or slightly larger than that of the wafer W, and is preferably formed of, for example, silicon carbide (SiC) or aluminum having a high heat conductivity.

The plurality of support pins 58 have a function of inhibiting the wafer W from being excessively heated and promoting cooling of the wafer W after heating. Therefore, the support pins 58 are preferably formed of a material having a high heat conductivity of, for example, 100 W/(m·k) or more, for example, silicon carbide (SiC). Note that to promote heat conduction from the wafer W to the susceptor 57, not only three support pins 58, but also much more support pins 58 may be provided.

Further, as illustrated in FIG. 9, inside a base plate 55, a water flow passage 55a for a cooling water is formed. To the water flow passage 55a, the cooling water is supplied from a cooling water supply apparatus 70 to cool the whole base plate 55 to a predetermined temperature. Further, support posts 56 that are provided on the base plate 55 and support the susceptor 57 are preferably formed of, for example, aluminum.

Further, in the wafer chamber 51, raising and lowering pins 59 that support the wafer W from below and raise and lower the wafer W when the wafer W is transferred in/out by passing through the base plate 55 and the susceptor 57 and performing a rising and lowering operation, and a raising and lowering mechanism 60 that raises and lowers the raising and lowering pins 59, are provided.

Further, one side wall of the housing 53 is formed with a transfer-in/out port (not illustrated) for the wafer W through which the wafer W is transferred into the wafer chamber 51 and transferred out of the wafer chamber 51 by the arm 71 of the main transfer mechanism MA. A shutter (not illustrated) is provided at the transfer-in/out port, and the transfer-in/out port is opened and closed by the shutter. It is preferable that the shutter can hermetically close the transfer-in/out port.

Further, an inert gas introduction port 51A is provided in a side wall of the housing 53, and an inert gas exhaust port 51B is provided at a bottom portion of the housing 53. To the inert gas introduction port 51A, an inert gas supply source 81 that stores (is filled with) the inert gas is connected, and the inert gas is supplied from the inert gas supply source 81 to the inside of the wafer chamber 51 through the inert gas introduction port 51A.

On the other hand, the light source chamber 52 placed above the wafer chamber 51 includes a light source L that irradiates the wafer W in the wafer chamber 51 with the ultraviolet light, and a power source 72 that supplies power to the light source L. The light source L is housed in a housing 73. An irradiation window 74 is provided in a bottom portion of the housing 73 so as to transmit the ultraviolet light emitted from the light source L, to the wafer chamber 51. The irradiation window 74 is formed of, for example, quartz glass. The ultraviolet light from the light source L is emitted toward the wafer chamber 51 through the irradiation window 74, and the ultraviolet light transmitted through the transmission window 54 of the wafer chamber 51 is applied to the wafer W.

In the ultraviolet light irradiation unit 40 configured as described above, the film of PS-b-PMMA formed on the wafer W in the coating unit 32 is heated and exposed as follows. Namely, the wafer W on which the film of PS-b-PMMA has been formed is transferred into the wafer chamber 51 by the arm 71 of the main transfer mechanism MA, received by the raising and lowering pins 59, and placed on the support pins 58 on the susceptor 57.

After the arm 71 of the main transfer mechanism MA retracts from the wafer chamber 51, the shutter is closed to isolate the inside of the wafer chamber 51 from the external environment. Then, the inert gas supply source 81 supplies the inert gas such as a nitrogen gas into the wafer chamber 51 for a predetermined time to thereby purge the air remaining in the wafer chamber 51. This brings the inside of the wafer chamber 51 to an inert gas atmosphere.

While purging the inside of the wafer chamber 51 with the inert gas, the wafer W supported on the support pins 58 is heated to a predetermined temperature by the heater 68 in the susceptor 57. After a lapse of a predetermined time, when the supply of the power to the heater 68 is stopped, the heat of the wafer W is transmitted to the base plate 55 via the support pins 58 and the susceptor 57, whereby the wafer W is cooled down to approximately room temperature (about 23° C.).

After the wafer W reaches approximately the room temperature, the power is supplied from the power source 72 to the light source L, and the ultraviolet light is emitted from the light source L. The ultraviolet light is transmitted through the irradiation window 74 of the light source chamber 52 and the transmission window 54 of the wafer chamber 51 and applied to the surface of the wafer W in the inert gas atmosphere. Since the dose amount required for exposure of the film of PS-b-PMMA is decided by "illuminance×irradiation time," it is preferable to decide an irradiation time according to the illuminance of the ultraviolet light through, for example, a preparatory experiment or the like.

After the ultraviolet irradiation for the predetermined time, the wafer W is transferred out of the ultraviolet light irradiation unit 40 by the reverse procedure to that when the wafer W is transferred in. Thereafter, the wafer W is transferred to the solution treatment unit 31 where the film of PS-b-PMMA is developed with the organic solvent (for example, IPA). Namely, the PMMA regions dissolve, whereby a pattern composed of the PS regions can be obtained.

The pattern forming apparatus 10 according to the second embodiment can preferably perform the pattern forming method according to the first embodiment. Namely, the effect and advantage exerted by the pattern forming method according to the first embodiment can also be exerted by the pattern forming apparatus 10 according to the second embodiment.

As described above, according to the pattern forming method and the pattern forming apparatus according to the embodiments of the present invention, a fine pattern composed of the PS regions can be formed by causing phase separation due to heating, exposing the film of PS-b-PMMA block copolymer, in which the PS regions and PMMA regions are regularly arrayed, to the ultraviolet light in the inert gas atmosphere, and developing the resultant with the organic solvent. In addition, the exposure in the inert gas atmosphere makes it possible to suppress excessive reaction between PMMA and oxygen by the ultraviolet light. Therefore, it is possible to suppress change in quality of PMMA and thereby prevent decrease in solubility of PMMA into the organic solvent. As a result, the solubility of PMMA to IPA can be made higher than the solubility of PS to IPA to improve the solubility ratio. Further, since the exposure with the ultraviolet light is performed in the inert gas atmosphere, the excessive reaction between PS and oxygen by the ultraviolet light can also be suppressed, and the change in quality of PS can also be suppressed. Therefore, the solubility ratio can further be improved.

The present invention has been described with reference to the referred embodiments of the present invention, but the present invention is not limited to the above-described embodiments and variously changed and modified within the scope of the spirit of the present invention as set forth in claims.

Though the example of forming the holes has been described in the first embodiment, the pattern forming method according to the embodiments of the present invention is also applicable to formation of a line-and-space pattern. In this case, after lines composed of the PS regions are formed by development with, for example, an organic solvent such as IPA, the lines may fall down due to the surface tension of IPA when drying the substrate. To prevent the falling, it is preferable to add, for example, a hydrophobic agent such as sililation agent to IPA to thereby decrease the surface tension. Examples of the sililation agent which can be added to IPA include trimethylsilyl dimethylamine (TMSDMA), dimethylsilyl dimethylamine (DMSDMA), trimethylsilyl diethylamine (TMSDEA), hexamethyldisilazane (HMDS), and trimethyldisilazane (TMDS). In the case of adding the hydrophobic agent to the organic solvent, the hydrophobic agent may be added to the organic solvent via the branch pipe 39B from the additive supply source 39A of the coating unit 32 in the second embodiment, or the organic solvent to which the hydrophobic agent has been added may be stored in the chemical supply source 39 in advance.

Further, after the development using the organic solvent such as IPA, liquid having a lower surface tension may be used to rinse away the organic solvent. Examples of the liquid include alcohols such as methyl alcohol and ethyl alcohol. The liquid can be supplied to the wafer W, for example, from the rinse solution discharge nozzle 8 of the solution treatment unit 31 in FIG. 8.

Further, examples of the block copolymer includes, but not limited to, PS-b-PMMA which has been exemplified in the above embodiments, polybutadiene-polydimethylsiloxane, polybutadiene-4-vinylpyridine, polybutadiene-methylmethacrylate, polybutadiene-poly-t-butylmethacrylate, polybutadiene-t-butylacrylate, poly-t-butylmethacrylate-poly-4-vinylpyridine, polyethylene-polymethylmethacrylate, poly-t-butylmethacrylate-poly-2-vinylpyridine, polyethylene-poly-2-vinylpyridine, polyethylene-poly-4-vinylpyridine, polyisoprene-poly-2-vinylpyridine, polymethylmethacrylate-polystyrene, poly-t-butylmethacrylate-polystyrene, polymethylacrylate-polystyrene, polybutadiene-polystyrene, polyisoprene-polystyrene, polystyrene-poly-2-vinylpyridine, polystyrene-poly-4-vinylpyridine, polystyrene-polydimethylsiloxane, polystyrene-poly-N,N-dimethylacrylamide, polybutadiene-sodium polyacrylate, polybutadiene-polyethyleneoxide, poly-t-butylmethacrylate-polyethyleneoxide, polystyrene-polyacrylic acid, polystyrene-polymethacrylic acid and so on.

Further, usable examples of the organic solvent that develops the film of PS-b-PMMA include, but not limited to IPA, methyl alcohol, ethyl alcohol, acetone, xylene and so on. Note that it is preferable to use IPA as the organic solvent in the case of using the block copolymer together with photoresist as in the above case of forming the holes. This is because the photoresist hardly dissolves in IPA.

Further, in the case where the film of PS-b-PMMA is developed with the organic solvent, the organic solvent may be increased in temperature depending on the organic solvent in use. In the case of IPA, it is preferable to increase it to a temperature, for example, 40° C. to 60° C. The increase in temperature can increase the solubility of the PMMA regions in the organic solvent.

Though the example that the Xe excimer lamp emitting ultraviolet light with a wavelength of 172 nm is exemplified as the light source L of the ultraviolet light in the above embodiments, for example, a low-pressure ultraviolet lamp (low-pressure mercury lamp) that emits ultraviolet light having high peaks at a wavelength of 185 nm and a wavelength of 254 nm, or a KrCl excimer lamp that emits single wavelength light with a wavelength of 222 nm may be used. Further, the light source L may be composed of a lamp having an emission spectrum that is comparatively broad, for example, from a far ultraviolet region to a vacuum ultraviolet region, and a wavelength cut filter cutting, for example, a wavelength longer than a wavelength of about 230 nm.

Figure 10:
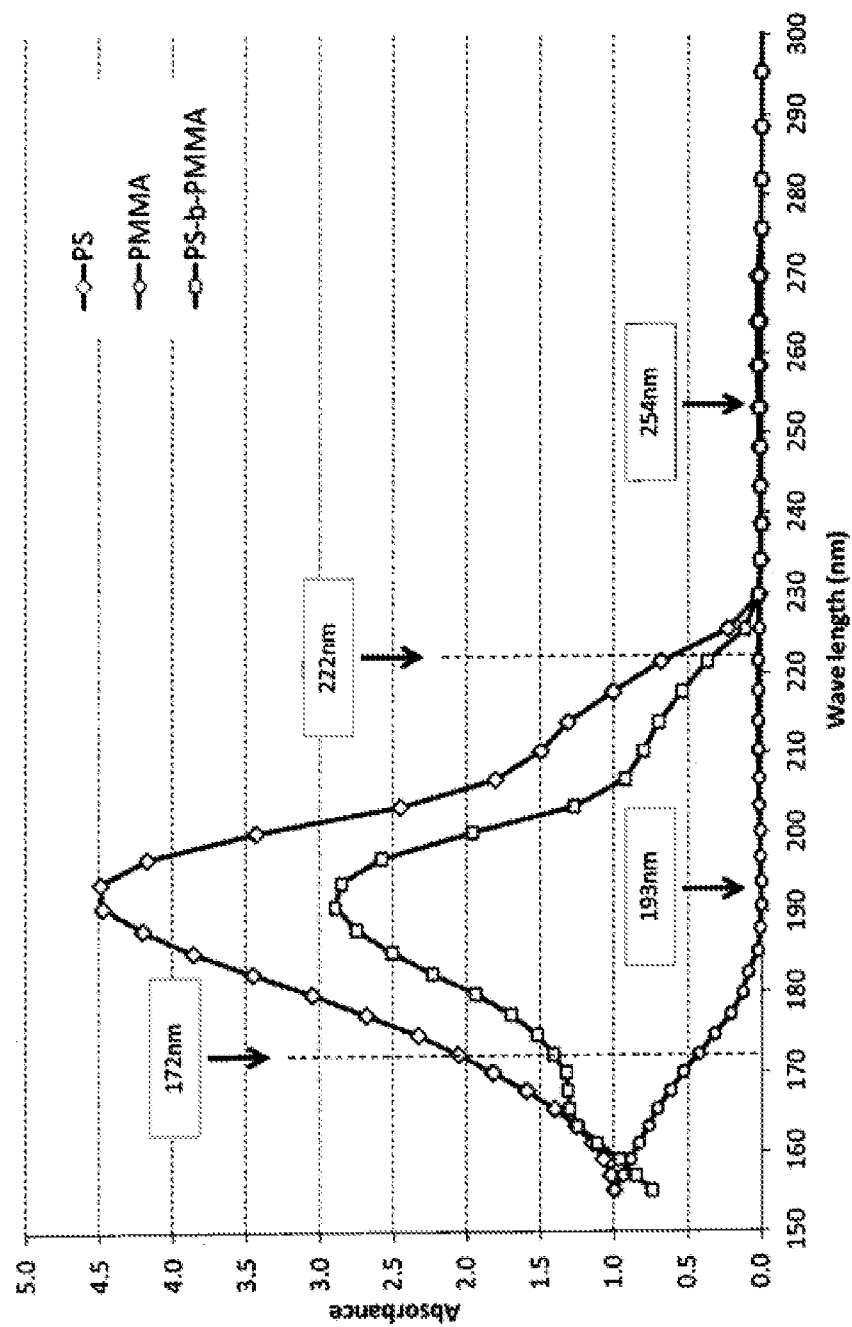
FIG. 10 A graph illustrating absorption coefficients of PS, PMMA and PS-b-PMMA with respect to the wavelength of ultraviolet light.

Incidentally, the wavelength of the ultraviolet light used in the present invention is most preferably 172 nm. FIG. 10 is a graph illustrating absorption coefficients of PS, PMMA, and PS-b-PMMA to the wavelength of the ultraviolet light, and the graph shows that PS-b-PMMA has a high absorption coefficient as a whole at 193 nm. However, the absorption coefficient of the PMMA itself is extremely low at 193 nm, and therefore actual progress of the scission reaction of the main chain in PMMA is extremely slow at 193 nm, with the result that the treatment requires a long time.

In this regard, at 172 nm, both of PS and PMMA indicate relatively high absorption coefficients and both of the cross-linking reaction in PS and the separation reaction of the main chain in PMMA proceed relatively fast. Therefore the treatment time is reduced as compared to that at 193 nm. Note that according to the graph, relatively high absorption coefficients are obtained in both of PS and PMMA at a wavelength shorter than 172 nm, but when the wavelength is shorter, the ultraviolet light irradiation atmosphere requires a lower oxygen concentration, so that an almost vacuum state is required, for example, at 160 nm. On the other hand, the ultraviolet light at 172 nm is sufficient in the inert gas atmosphere such as a nitrogen gas as has been described. In addition, the lamp filled with an Xe gas is used as the light source to obtain the ultraviolet light with a single wavelength unlike the mercury lamp, and is thus excellent in energy efficiency.

Accordingly, in consideration of the above points, the wavelength of the ultraviolet light used in the present invention is most preferably 172 nm.

Further, the time for applying the ultraviolet light can be appropriately adjusted according to the block copolymer in use, the film thickness of the block copolymer, the intensity of the ultraviolet light in use and so on.

Further, though the pattern forming apparatus 10 having the solution treatment unit 31 and the ultraviolet light irradiation unit 40 incorporated therein has been described in the second embodiment, the solution treatment unit 31 and the ultraviolet light irradiation unit 40 are not incorporated in the pattern forming apparatus 10 but may be provided separately from the pattern forming apparatus 10. Further, the solution treatment unit 31 and the ultraviolet light irradiation unit 40 may be integrally configured in another embodiment. Further, the pattern forming apparatus according to still another embodiment may be configured by combining the solution treatment unit 31, the coating unit 32, and the ultraviolet light irradiation unit 40. Further, the susceptor 57 of the ultraviolet light irradiation unit 40 has the heater 68 and heats the film of the block polymer in the ultraviolet light irradiation unit 40, but a heating unit that heats the film of the block copolymer may be provided not in the ultraviolet light irradiation unit 40 but separately from the ultraviolet light irradiation unit 40.

EXPLANATION OF CODES

21 . . . film
PL . . . photoresist layer
S1 . . . cassette station
S2 . . . treatment station
S3 . . . interface station
31 . . . solution treatment unit
5 . . . chemical supply nozzle
32 . . . coating unit
39 . . . chemical supply source
39A . . . additive supply source
40 . . . ultraviolet light irradiation unit
51 . . . wafer chamber
52 . . . light source chamber
57 . . . susceptor
58 . . . support pin
68 . . . heater
81 . . . inert gas supply source
OS . . . organic solvent
DS . . . PS region
DM . . . PMMA region
W . . . wafer
L . . . light source

What is claimed:

1. A pattern forming method of forming a pattern on a substrate using a block copolymer PS-b-PMMA, the pattern forming method comprising the steps of:
    forming a film of a block copolymer PS-b-PMMA containing at least two kinds of polymers on the substrate;
    heating the film of the block copolymer;
    irradiating the heated film of the block copolymer with ultraviolet light, from an Xe excimer lamp, in an atmosphere of an inert gas; and
    supplying an organic solvent to the film of the block copolymer irradiated with the ultraviolet light.

2. The pattern forming method according to claim 1, wherein an oxygen concentration in the inert gas is 400 ppm or less.

3. The pattern forming method according to claim 1, wherein a hydrophobic agent is added to the organic solvent.

4. The pattern forming method according to claim 1, wherein the organic solvent is isopropyl alcohol.

5. The pattern forming method according to claim 1, further comprising the step of:
    prior to the forming the film of the block copolymer on the substrate, forming a photoresist layer having a recessed portion on the substrate.

6. A pattern forming apparatus for forming a pattern on a substrate using a block copolymer PS-b-PMMA, the pattern forming apparatus comprising:
    a film forming unit that supplies a coating solution containing the block copolymer PS-b-PMMA to the substrate to form a film of the block copolymer on the substrate;
    a heating unit that heats the substrate on which the film of the block copolymer has been formed by the film forming unit;

an ultraviolet light irradiation unit that comprises therein an inert gas supply unit that supplies an inert gas, and an Xe excimer lamp that irradiates the heated film of the block copolymer with ultraviolet light in an atmosphere of the inert gas; and
a solution treatment unit that supplies an organic solvent to the film of the block copolymer irradiated with the ultraviolet light.

7. The pattern forming apparatus according to claim 6, wherein the heating unit is provided in the ultraviolet light irradiation unit.

8. The pattern forming apparatus according to claim 6, wherein the inert gas supply unit stores an inert gas with an oxygen concentration of 400 ppm or less.

9. The pattern forming apparatus according to claim 6, wherein the solution treatment unit is provided with a first supply source that stores the organic solvent.

10. The pattern forming apparatus according to claim 9, wherein the solution treatment unit is provided with a second supply source that stores a hydrophobic agent, and
wherein the second supply source and the first supply source are connected together by a predetermined pipeline.

11. A non-transitory computer-readable storage medium storing a computer program controlling a pattern forming apparatus to cause the pattern forming apparatus to perform a pattern forming method of forming a pattern on a substrate using a block copolymer PS-b-PMMA, the pattern forming method comprising the steps of:
forming a film of a block copolymer PS-b-PMMA containing at least two kinds of polymers on the substrate;
heating the film of the block copolymer;
irradiating the heated film of the block copolymer with ultraviolet light, from an Xe excimer lamp, in an atmosphere of an inert gas; and
supplying an organic solvent to the film of the block copolymer irradiated with the ultraviolet light, and, the pattern forming apparatus comprising:
a film forming unit that supplies a coating solution containing the block copolymer to the substrate to form a film of the block copolymer PS-b-PMMA on the substrate;
a heating unit that heats the substrate on which the film of the block copolymer has been formed by the film forming unit;
an ultraviolet light irradiation unit that comprises therein an inert gas supply unit that supplies an inert gas, and the Xe excimer lamp that irradiates the heated film of the block copolymer with ultraviolet light in an atmosphere of the inert gas; and
a solution treatment unit that supplies an organic solvent to the film of the block copolymer irradiated with the ultraviolet light.

\* \* \* \* \*